United States Patent
Nallan et al.

(10) Patent No.: US 7,217,665 B2
(45) Date of Patent: May 15, 2007

(54) METHOD OF PLASMA ETCHING HIGH-K DIELECTRIC MATERIALS WITH HIGH SELECTIVITY TO UNDERLYING LAYERS

(75) Inventors: Padmapani C. Nallan, San Jose, CA (US); Guangxiang Jin, San Jose, CA (US); Ajay Kumar, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 42 days.

(21) Appl. No.: 10/301,239

(22) Filed: Nov. 20, 2002

(65) Prior Publication Data

US 2004/0097092 A1  May 20, 2004

(51) Int. Cl.
*H01L 21/302* (2006.01)

(52) U.S. Cl. .................. 438/714; 438/711; 438/722; 216/67; 216/68; 216/76

(58) Field of Classification Search .............. 438/711, 438/714, 722; 216/67, 68, 76
See application file for complete search history.

(56) References Cited

U.S. PATENT DOCUMENTS

| | | | |
|---|---|---|---|
| 5,431,778 A | 7/1995 | Dahm et al. | |
| 5,776,356 A * | 7/1998 | Yokoyama et al. | 216/76 |
| 5,814,563 A | 9/1998 | Ding et al. | 438/714 |
| 5,972,758 A | 10/1999 | Liang | 438/294 |
| 6,228,731 B1 | 5/2001 | Liaw et al. | 438/303 |
| 6,232,174 B1 * | 5/2001 | Nagata et al. | 438/253 |
| 6,235,593 B1 | 5/2001 | Huang | 438/279 |
| 6,242,331 B1 | 6/2001 | Chu et al. | 438/586 |
| 6,368,518 B1 | 4/2002 | Vaartstra | 216/67 |
| 6,432,785 B1 | 8/2002 | Wu | 438/305 |
| 6,437,377 B1 * | 8/2002 | Ajmera et al. | 257/204 |
| 6,451,647 B1 | 9/2002 | Yang et al. | 438/240 |
| 6,451,673 B1 | 9/2002 | Okada et al. | 438/513 |
| 6,485,988 B2 * | 11/2002 | Ma et al. | 438/3 |
| 6,509,219 B2 * | 1/2003 | Tsou et al. | 438/197 |
| 6,599,667 B2 * | 7/2003 | Yusa et al. | 430/5 |
| 6,620,733 B2 | 9/2003 | Ho | |
| 6,642,557 B2 * | 11/2003 | Liang | 257/213 |
| 6,727,150 B2 * | 4/2004 | Tang | 438/296 |
| 6,835,612 B2 * | 12/2004 | Cappellani et al. | 438/197 |
| 6,858,907 B2 * | 2/2005 | Ryu et al. | 257/412 |
| 2001/0042890 A1 | 11/2001 | Liang | 257/374 |
| 2002/0142523 A1 | 10/2002 | Ryu et al. | 438/139 |
| 2003/0211748 A1 * | 11/2003 | Jin et al. | 438/709 |
| 2004/0014327 A1 | 1/2004 | Ji et al. | 438/722 |
| 2002/0096695 A1 | 7/2004 | Ajmera et al. | 257/204 |
| 2002/0132437 A1 | 9/2004 | Tsou et al. | 438/341 |

FOREIGN PATENT DOCUMENTS

| | | | |
|---|---|---|---|
| JP | 06-151383 | * | 5/1994 |
| JP | 06151383 | | 5/1994 |
| JP | 11-293481 | * | 10/1999 |
| JP | 11293481 | | 10/1999 |
| WO | 02/078058 | | 10/2002 |
| WO | WO 03/012851 | | 2/2003 |
| WO | WO 2004/109772 | | 12/2004 |

OTHER PUBLICATIONS

"Comparison of Plasma Chemistries For Dry Etching of Ta2O5"; Lee et. al.; J. Vac. Sci. Tech. A; □vol. 18; No. 4; Lee et. al.; Aug. 2000'; pp. 1169-1172.*
Lee K.P. et al., "Comparison of plasma chemistries for dry etching of $Ta_2O_5$." Journal of Vacuum Science and Technology, Vacuum, Surfaces and Films, American Institute of Physics, New York, NY vol. 18, No. 4, Jul. 2000, pp. 1169-1172, xp012005108, ISSN 0734-2101.

* cited by examiner

*Primary Examiner*—George A. Goudreau
(74) *Attorney, Agent, or Firm*—Moser IP Law Group

(57) ABSTRACT

A method of plasma etching a layer of dielectric material having a dielectric constant that is greater than four (4). The method includes exposing the dielectric material layer to a plasma comprising a hydrocarbon gas and a halogen containing gas.

31 Claims, 4 Drawing Sheets

400

| PROCESS OF THE PRESENT INVENTION UTILIZING A DPS CHAMBER — 404 | | | | |
|---|---|---|---|---|
| PARAMETER | UNITS | RANGE | | ONE EMBODIMENT — 402 |
| | | MIN | MAX | |
| $Cl_2$ | SCCM | 5 | 300 | 40 |
| $CH_4$ | SCCM | 2 | 200 | 10 |
| CO | SCCM | 0 | 300 | 0 |
| TOTAL PRESSURE | mTORR | 2 | 100 | 4 |
| ANTENNA POWER | WATTS | 200 | 2500 | 1100 |
| PEDESTAL POWER | WATTS | 0 | 100 | 20 |
| PEDESTAL TEMPERATURE | DEGREES CELSIUS | 10 | 500 | 350 |

400

| PROCESS OF THE PRESENT INVENTION UTILIZING A DPS CHAMBER | | | | |
|---|---|---|---|---|
| PARAMETER | UNITS | RANGE | | ONE EMBODIMENT |
| | | MIN | MAX | |
| $Cl_2$ | SCCM | 5 | 300 | 40 |
| $CH_4$ | SCCM | 2 | 200 | 10 |
| CO | SCCM | 0 | 300 | 0 |
| TOTAL PRESSURE | mTORR | 2 | 100 | 4 |
| ANTENNA POWER | WATTS | 200 | 2500 | 1100 |
| PEDESTAL POWER | WATTS | 0 | 100 | 20 |
| PEDESTAL TEMPERATURE | DEGREES CELSIUS | 10 | 500 | 350 |

FIG. 4

METHOD OF PLASMA ETCHING HIGH-K DIELECTRIC MATERIALS WITH HIGH SELECTIVITY TO UNDERLYING LAYERS

BACKGROUND OF THE INVENTION

1. Field of Invention

The present invention relates generally to a method of dry etching semiconductor wafers. More specifically, the invention relates to a method of etching high-K dielectric materials using a gas mixture comprising a halogen gas and a hydrocarbon gas.

2. Description of the Background Art

Field effect transistors that are used in forming integrated circuit generally utilize a polysilicon gate electrode deposited upon a gate dielectric that separates the electrode from the channel between the source and the drain regions. In prior art transistor structures, the gate dielectric is typically fabricated of silicon dioxide ($SiO_2$). However, as integrated circuit transistors have become smaller (on the order of 100 nanometers in width), the thickness of the dielectric material in the gate structure has become thinner than 10 Angstroms. With such a thin dielectric, electrons can propagate from the polysilicon gate electrode into the transistor channel causing the transistor to operate improperly or become defective.

This leakage of electrons from the gate electrode through the gate oxide has led researchers to investigate the use of more stable high-K dielectric materials. Various types of stable dielectric material having a high dielectric constant include hafnium-dioxide ($HfO_2$) and hafnium-silicate ($HfSiO_2$). However, hafnium-dioxide and hafnium-silicate are such stable dielectric materials that it is very difficult to etch either of them by using conventional oxide etchants to form gate structures without damaging other layers of material residing on the wafer. As such, high-K dielectrics such as hafnium-dioxide and hafnium-silicate have found limited use in semiconductor devices.

Therefore, there is a need in the art for a high-K material etching process having very high selectivity to silicon oxide, polysilicon, and silicon.

SUMMARY OF INVENTION

The disadvantages associated with the prior art are overcome by the present invention for etching materials with high dielectric constants (high-K materials have a dielectric constant greater than 4.0) such as $HfO_2$, $HFSiO_2$, $ZrO_2$, $Al_2O_3$, BST, PZT, $ZrSiO_2$, $TaO_2$, and the like using a gas mixture comprising a halogen gas and hydrocarbon gas. In one embodiment of the invention, an etch gas (or mixture) comprising chlorine ($Cl_2$) and methane ($CH_4$) is used for etching dielectric films, such as hafnium-dioxide and hafnium-silicate films.

BRIEF DESCRIPTION OF DRAWINGS

The teachings of the present invention can be readily understood by considering the following detailed description in conjunction with the accompanying drawings, in which:

FIG. 4 is a table summarizing the processing parameters of one embodiment of the inventive method when practiced using the apparatus of FIG. 1.

To facilitate understanding, identical reference numerals have been used, where possible, to designate identical element that are common to the figures.

DETAILED DESCRIPTION

The present invention is a method of etching materials with high dielectric constants (high-K materials have dielectric constants greater than 4.0) using a plasma generated from a gas (or gas mixture) comprising gases containing a halogen gas, such as $Cl_2$, HCl and the like, as well as a hydrocarbon gas, such as methane ($CH_4$), ethylene ($C_2H_4$), propane ($C_3H_8$), butane ($C_4H_{10}$), and the like. Optionally, a reducing gas (such as carbon monoxide (CO)) may also be added to the gas mixture. The high-K materials include $HfO_2$, $ZrO_2$, $Al_2O_3$, BST, PZT, $ZrSiO_2$, $HfSiO_2$, $TaO_2$, and the like.

The type of halogen gas (e.g., $Cl_2$) is selected to best remove the metal from the dielectric layer. The hydrocarbon (e.g., methane) is selected to best serve as a polymerizing gas to combine with by-products produced during the etch process. Specifically, the methane is used to suppress the silicon etch rate, such that a high high-K dielectric (e.g., $HfO_2$ or $HfSiO_2$) to silicon selectivity is obtained. The type of reducing gas is selected to best remove the oxygen from the dielectric layer. The etch process of the present invention can be reduced to practice in any plasma etch chamber, for example, a Decoupled Plasma Source (DPS) etch process chamber or a DPS-II etch process chamber, both of which are available from Applied Materials, Inc. of Santa Clara, Calif.

Figure 1:
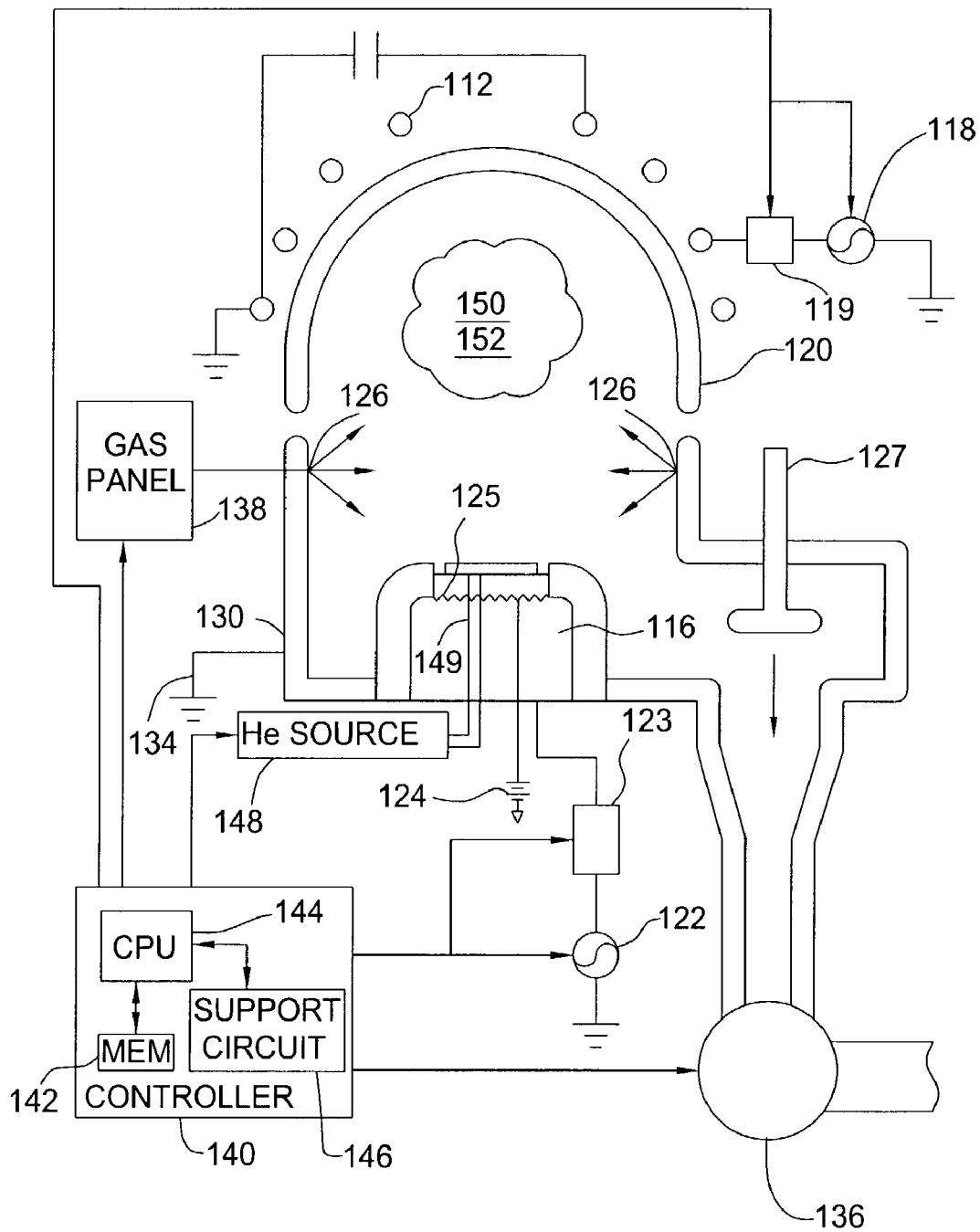
FIG. 1 depicts a schematic diagram of a plasma processing apparatus of the kind used in performing the etching processes according to one embodiment of the present invention.

FIG. 1 depicts a schematic diagram of the DPS etch process chamber 100, that comprises at least one inductive coil antenna segment 112, positioned exterior to a dielectric, dome-shaped ceiling 120 (referred to herein as the dome 120). Other chambers may have other types of ceilings, e.g., a flat ceiling. The antenna segment 112 is coupled to an upper radio-frequency (RF) source 118 through a matching network 119. In one embodiment, the RF power applied to the inductive coil antenna 112 is in a range between about 200 to 2500 Watts at a frequency between about 50 kHz and 13.56 MHz.

The process chamber 100 also includes a substrate support pedestal (biasing element, e.g., cathode) 116 that is coupled to a second (biasing) RF source 122 that is generally capable of producing an RF signal having bias power between about 5 and 500 Watts at a frequency of approximately 13.56 MHz. The biasing source 122 is coupled to the biasing element 116 through a matching network 123. The chamber 100 also contains a conductive chamber wall 130 that is connected to an electrical ground 134. A controller 140 comprising a central processing unit (CPU) 144, a memory 142, and support circuits 146 for the CPU 144 is coupled to the various components of the DPS etch process chamber 100 to facilitate control of the etch process.

In operation, a semiconductor substrate 114 is placed on the substrate support pedestal 116 and is retained thereon by conventional techniques, such as electrostatic chucking or mechanical clamping of the substrate 114. Gaseous components are supplied from a gas panel 138 to the process chamber 100 through entry ports 126 to form a gaseous mixture 150. The gaseous mixture 150 is ignited into a plasma 152 in the process chamber 100 by applying RF power from the RF sources 118 and 122 respectively to the antenna 112 and the biasing element (e.g., chucking electrode) 116. The pressure within the interior of the etch chamber 100 is controlled using a throttle valve 127 situated between the chamber 100 and a vacuum pump 136. The temperature at the surface of the chamber walls 130 is controlled using liquid-containing conduits (not shown) that are located in the walls 130 of the chamber 100.

The temperature of the substrate 114 is controlled by stabilizing the temperature of the support pedestal 116 and flowing helium gas from source 148 via conduit 149 to channels formed by the back of the substrate 114 and grooves (not shown) on the pedestal surface. The helium gas is used to facilitate heat transfer between the pedestal 116 and the substrate 114. During the etch process, the substrate 114 is heated by a resistive heater 125 within the pedestal 116 to a steady state temperature via a DC power source 125, and the helium facilitates uniform heating of the substrate 114. Using thermal control of both the dome 120 and the pedestal 116, the substrate 114 is maintained at a temperature of between 10 and 500 degrees Celsius.

Those skilled in the art will understand that other forms of etch chambers may be used to practice the invention. For example, chambers with remote plasma sources, microwave plasma chambers, electron cyclotron resonance (ECR) plasma chambers, and the like may be utilized as well to practice the invention.

To facilitate control of the chamber as described above, the CPU 144 may be one of any form of general-purpose computer processor that can be used in an industrial setting for controlling various chambers and subprocessors. The memory 142 is coupled to the CPU 144. The memory 142, or computer-readable medium, may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. An etching process 200 is generally stored in the memory 142 as a software routine 202. The software routine 202 may also be stored and/or executed by a second CPU (not shown) that is remotely located from the hardware being controlled by the CPU 144.

Figure 2:
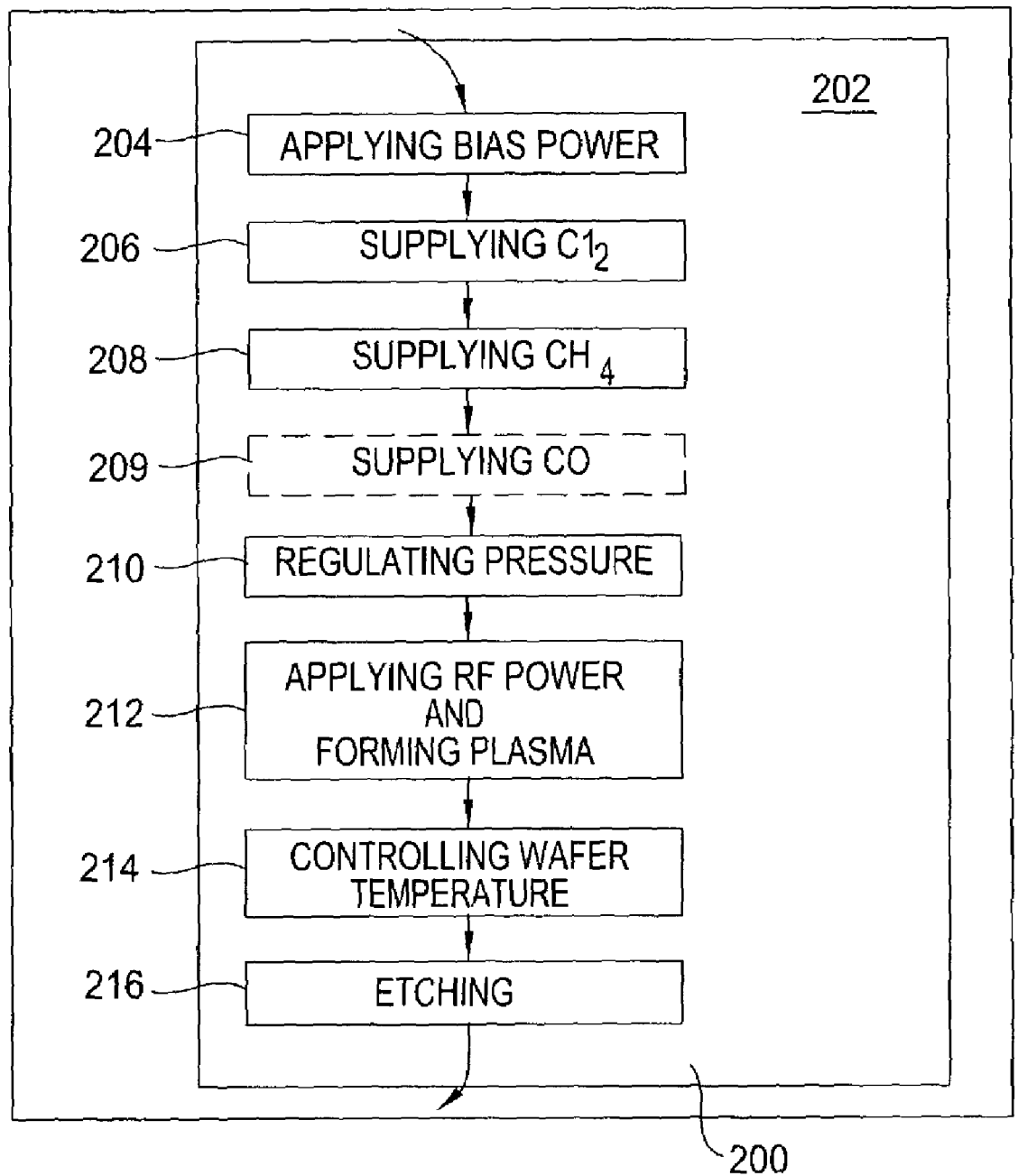
FIG. 2 depicts a flow diagram of method for performing an etching process for a high-K dielectric material.

The specific embodiment of the etching process 200 depicted in FIG. 2 comprises the steps of applying bias power to the pedestal (step 204); supplying a halogen gas such as chlorine ($Cl_2$) to the chamber 100 (step 206); supplying a hydrocarbon such as methane ($CH_4$) to the chamber 100 (step 208); and regulating the pressure of the $Cl_2$ and $CH_4$ (step 210). RF power is applied to form a plasma (step 212), and the wafer temperature is regulated (step 214). The silicon is etched (step 216) for a duration that continues until an unmasked portion of high-K dielectric (e.g., hafnium-dioxide, hafnium-silicate, and the like) is removed. The etch time is terminated upon a certain optical emission occurring, upon a particular duration occurring or upon some other indicator determining that the hafnium-dioxide has been removed.

The foregoing steps of the process 200 need not be performed sequentially. For example, some or all of the steps may be performed simultaneously or in another order to etch a hafnium-dioxide, hafnium-silicate, or other high-K dielectric layer.

The software routine 202 is discussed with respect to FIG. 1 and FIG. 2. The software routine 202 is executed after a wafer 114 is positioned on the pedestal 116. The software routine 202, when executed by the CPU 144, transforms the general-purpose computer into a specific purpose computer (controller) 140 that controls the chamber operation such that the etching process 200 is performed. Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

Continuing to refer to FIG. 1 and FIG. 2, a wafer or other form of workpiece 114 is etched, for example, by applying a bias power in the range of 0–100 Watts to the pedestal 116 in step 204. The gaseous mixture 150 is supplied to the chamber 100 at a rate in the range of 5–300 sccm $Cl_2$ and 2–200 sccm $CH_4$ in steps 206 and 208, respectively. Such flow rates define a flow ratio of $Cl_2$ to $CH_4$ in the range of (0.025:1) to (150:1). In one specific embodiment, the flow ratio of $Cl_2$ to $CH_4$ is about 4:1. In step 210, the total pressure of the gas mixture 150 is regulated to maintain a pressure in the range of 2–100 mTorr.

In a second embodiment, at optional step 209 (drawn in phantom), a reducing gas, such as carbon monoxide (CO) is added to the mixture 150. Recall, adding carbon monoxide to the mixture 150 helps reduce oxygen from the dielectric layer that may be present. In this instance, at steps 206, 208, and 209, the gaseous mixture 150 supplied to the chamber 100 comprises $Cl_2$ at a rate in a range of about 5–300 sccm, $CH_4$ in a range of about 2–200 sccm, and CO in a range of about 5–300 sccm. As such, the flow rates define a flow ratio of $Cl_2$ to $CH_4$ in a range of about (0.025:1) to (150:1), a flow ratio of $Cl_2$ to CO in a range of about (0.016:1) to (150:1), and a flow ratio of CO to $CH_4$ in a range of about (0.025:1) to (150:1). In one specific embodiment, the flow ratio of $Cl_2$ to $CH_4$ to CO is 1:1:0.5. The method 202 then proceeds to step 210, as discussed above.

Once the gas mixture 150 is present above the wafer 114, step 212 applies 200–2500 Watts of RF power to the antenna 112, and plasma 152 is formed. The wafer 114 is heated to 10–500 degrees Celsius in step 214. Etching of the wafer 114 occurs in step 216.

In one specific recipe for etching hafnium-dioxide, the processing chamber 100 has a pedestal bias power of 20 watts, a gas flow rate of 40 sccm of $Cl_2$ and 10 sccm of $CH_4$, a chamber pressure of 4 mtorr, an antenna power of 1100 watts, and a pedestal temperature of 350° C. In another specific recipe for etching hafnium-silicate, the chamber 100 uses a pedestal bias power of 50 watts, a gas flow rate of 40 sccm of $Cl_2$ and 10 sccm of $CH_4$, a chamber pressure of 4 mtorr, an antenna power of 400 watts, and a pedestal temperature of 250° C.

FIG. 4 presents a table 400 summarizing the etch process parameters through which one can practice the invention using a DPS Centura® system. The etch process parameters for one embodiment of the invention presented above are summarized in column 402. The process ranges are presented in column 404. It should be understood, however, that the use of a different chamber may necessitate different process parameter values and ranges.

Figure 3A:
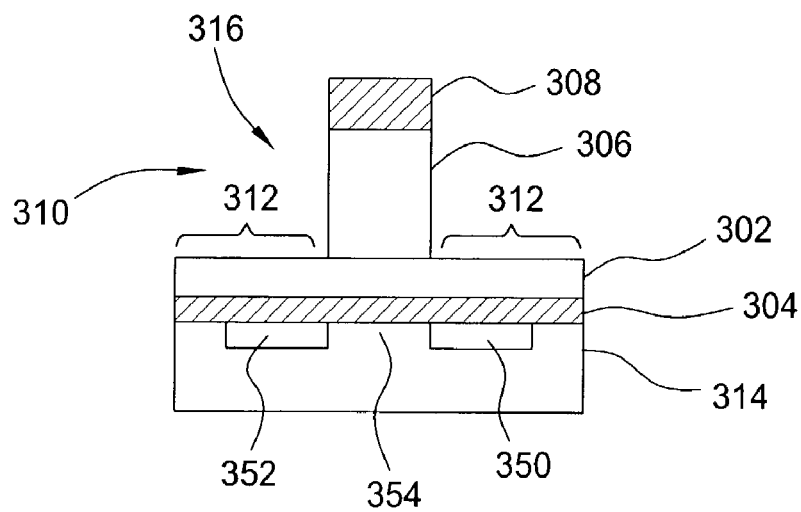
FIG. 3A depicts a schematic cross-sectional view of a wafer having a high-K dielectric layer undergoing an etching process in accordance with the method of FIG. 2.

One illustrative embodiment of the inventive process is used for etching a wafer 114 containing a film stack 310 to form a gate structure of a transistor. FIG. 3A depicts a schematic cross-sectional view of a wafer 114 having a high-K dielectric layer 302 undergoing an etching process in accordance with the method 200 of FIG. 2.

The wafer 114 comprises a doped layer 314 having a drain region 350, a source region 352 and a channel 354 therebetween, a silicon dioxide layer 304 (optional), a high-K dielectric layer 302, a polysilicon layer 306, and an etch mask 308. The mask 308 may be a photoresist mask or a hard mask (e.g., $SiO_2$, SiN, amorphous carbon, and the like).

The etch mask 308 is illustratively patterned to form a gate region 316 over the channel 354. Specifically, FIG. 3A shows the remaining stack layers 310 of the structure after a previous etching step was performed to etch the polysilicon layer 306 and form the gate region 316 under the mask 308. The previous etch step to etch the polysilicon layer 306 is performed in a conventional manner. The mask 308 also leaves a portion 312 of the high-K dielectric layer 302 exposed to the etch chemistry for further processing in accordance with the method 200 discussed above with regard to FIG. 2. An underlying, optional silicon dioxide layer 304 is conventionally etched after the high-K dielectric in region 312 is removed.

In one embodiment where the high-K dielectric material 302 is hafnium-silicate ($HfSiO_2$), and the etching process is performed at temperatures greater than 100° C., the hafnium-silicate is etched using the $Cl_2/CH_4$ chemistry at a rate of about 100 Å/min with a selectivity to $SiO_2$ of greater than 3:1. The selectivity to silicon and polysilicon is also greater than 3:1.

In a second embodiment where the high-K dielectric material 302 is hafnium-dioxide ($HfO_2$), the hafnium-dioxide is etched by the $Cl_2/CH_4$ chemistry at a rate of about 100 Å/min with a selectivity to $SiO_2$ of greater than 10:1. The selectivity to silicon and polysilicon is greater than 3:1.

Figure 3B:
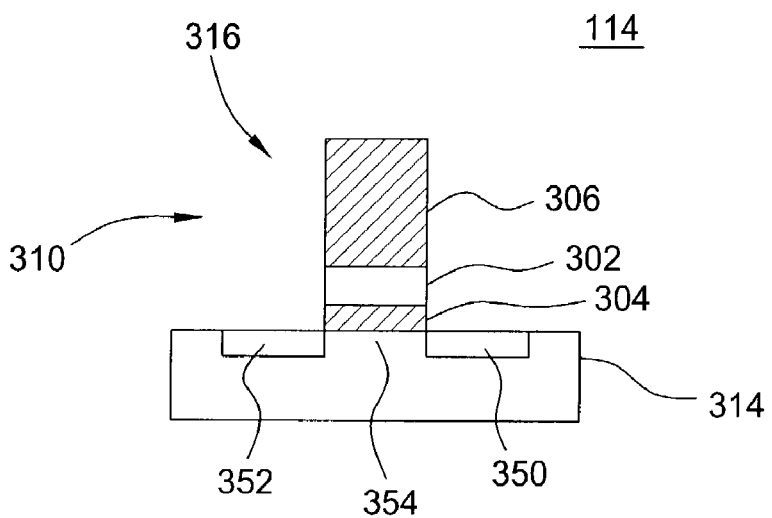
FIG. 3B depicts a schematic cross-sectional view of a gate structure formed during the etching process in accordance with the method of FIG. 2.

The result of the inventive etching method is best appreciated by referring to a gate structure depicted in FIG. 3B. FIG. 3B depicts a schematic cross-sectional view of a gate structure comprising the high-K dielectric layer of FIG. 3A that has been etched using a chlorine and methane etching chemistry according to an example of the present invention.

FIG. 3B depicts a schematic cross-sectional view of a gate structure 316 formed during the etching process in accordance with the method 200 of FIG. 2. Specifically, the profile shown in FIG. 3B illustrates the wafer 114 of FIG. 3A after completion of the etching process. The high-K dielectric layer ensures that, during transistor operation, electrons will not flow (leak) from the gate electrode to the channel. Typically, the thickness of the high-K dielectric is less than 5 nanometers.

The invention may be practiced in other etching equipment wherein the processing parameters may be adjusted to achieve acceptable etch characteristics by those skilled in the arts by utilizing the teachings disclosed herein without departing from the spirit of the invention.

What is claimed is:

1. A method of plasma etching a layer of dielectric material, comprising:
   etching said dielectric material layer in a plasma comprising a hydrocarbon gas and a chlorine containing gas, wherein the dielectric material is at least one of $HfO_2$, $HfSiO_2$, $ZrO_2$, $Al_2O_3$, $ZrSiO_2$, and $TaO_2$, wherein the hydrocarbon gas is a gas selected from the hydrocarbon gas group consisting of methane, ethylene, propane, and butane, and wherein said chlorine containing gas is $Cl_2$.

2. A method of plasma etching a layer of dielectric material, comprising:
   etching said dielectric material layer in a plasma comprising a hydrocarbon gas and a halogen containing gas, wherein the dielectric material is at least one of $HfO_2$, $HfSiO_2$, $ZrO_2$, $Al_2O_3$, $ZrSiO_2$, and $TaO_2$, wherein the hydrocarbon gas is a gas selected from the hydrocarbon gas group consisting of methane, ethylene, propane, and butane, and wherein said etching step further comprises providing a gas flow ratio of $Cl_2$ to $CH_4$ in the range of about (0.025:1) to (150:1).

3. The method of claim 2 wherein said etching step further comprises:
   providing a gas flow ratio of $Cl_2$ to $CH_4$ in the range of about 4:1.

4. The method of claim 2 wherein said etching step further comprises the step of:
   supplying 5 to 300 sccm of $Cl_2$ and 2 to 200 scan of $CH_4$.

5. A method of plasma etching a layer of dielectric material, comprising;
   etching said dielectric material layer in a plasma comprising a hydrocarbon gas and a halogen containing gas, wherein the dielectric material is at least one of $HfO_2$, $HfSiO_2$, $ZrO_2$, $Al_2O_3$, $ZrSiO_2$, and $TaO_2$, wherein the plasma further comprises a reducing gas.

6. The method of claim 5 wherein the reducing gas comprises carbon monoxide (CO).

7. The method of claim 2 wherein said etching step further comprises the step of:
   supplying 5 to 300 sccm of $Cl_2$, 2 to 200 sccm of $CH_4$, and 5 to 300 sccm of CO.

8. The method of claim 2 wherein said etching step further comprises:
   providing a gas flow ratio of $Cl_2$ to $CH_4$ in a range of about (0.025:1) to (150:1), a flow ratio of $Cl_2$ to CO in a range of about (0.016:1) to (150:1), and a flow ratio of CO to $CH_4$ in a range of about (0.025:1) to (150:1).

9. The method of claim 2 wherein said etching step further comprises:
   providing a gas flow ratio of $Cl_2$ to $CH_4$ to CO of about (1.0):(0.5):(1.0).

10. The method of claim 2 further comprising the step of:
    applying a bias power to a biasing element of up to 100 W.

11. The method of claim 2 further comprising the step of:
    applying an inductive source power to an inductively coupled antenna of 200 to 2500 W.

12. A method of plasma etching a layer of dielectric material, comprising:
    etching a workpiece having a dielectric material layer comprising hafnium-dioxide ($HfO_2$) in a plasma comprising a hydrocarbon gas and a halogen containing gas; and
    maintaining the workpiece comprising the dielectric material layer of hafnium-dioxide ($HfO_2$) at a temperature between 10 to 500 degrees Celsius.

13. A method of plasma etching a layer of dielectric material, comprising:
    etching said dielectric material layer in a plasma comprising a hydrocarbon gas and a halogen containing gas, wherein the dielectric material comprises hafnium dioxide ($HfO_2$), and wherein the hydrocarbon gas is a gas selected from the hydrocarbon gas group consisting of methane, ethylene, propane, and butane; and maintaining a workpiece comprising the dielectric material layer of hafnium-dioxide (HfO$_2$) at a temperature of 350 degrees Celsius.

14. A method of plasma etching a layer of dielectric material, comprising:
   etching a workpiece having a dielectric material layer comprising hafnium-silicate (HfSiO$_2$) in a plasma comprising a hydrocarbon gas and a halogen containing gas; and
   maintaining the workpiece comprising the dielectric material layer of hafnium-silicate (HfSiO$_2$) at a temperature between 10 to 500 degrees Celsius.

15. A method of plasma etching a layer of dielectric material, comprising:
   etching said dielectric material layer in a plasma comprising a hydrocarbon gas and a halogen containing gas, wherein the dielectric material comprises hafnium-silicate (HfSiO$_2$), and wherein the hydrocarbon gas is a gas selected from the hydrocarbon gas group consisting of methane, ethylene, propane, and butane; and
   maintaining a workpiece comprising the dielectric material layer of hafnium-silicate (HfSiO$_2$) at a temperature of 350 degrees Celsius.

16. A method for plasma etching a workpiece having a layer of hafnium-dioxide comprising the steps of:
   supplying chlorine gas and methane gas at a flow ratio in a range of about (0.025:1) to (150:1);
   maintaining a gas pressure of between 2–100 mTorr;
   applying a bias power to a cathode electrode of between 5 to 100 W;
   applying power to an inductively coupled antenna of between 200 to 2500 W to produce a plasma containing said chlorine gas and said methane gas that etches the workpiece; and
   maintaining said workpiece at a temperature between 10 and 500 degrees Celsius.

17. A method for plasma etching a workpiece having a layer of hafnium-silicate comprising the steps of:
   supplying chlorine gas and methane gas at a flow ratio in a range of about (0.025:1) to (150:1);
   maintaining a gas pressure of between 2–100 mTorr;
   applying a bias power to a cathode electrode of between 5 to 100 W;
   applying power to an inductively coupled antenna of between 200 to 2500 W to produce a plasma containing said chlorine gas and said methane gas that etches the workpiece; and
   maintaining said workplace at a temperature between 10 and 500 degrees Celsius.

18. A method of plasma etching a layer of dielectric material, comprising:
   etching said dielectric material layer in a plasma comprising a hydrocarbon gas and a halogen containing gas, wherein the dielectric material is at least one of HfO$_2$, HfSiO$_2$, ZrO$_2$, Al$_2$O$_3$, ZrSiO$_2$, and TaO$_2$, wherein the hydrocarbon gas is a gas selected from the hydrocarbon gas group consisting of methane, ethylene, propane, and butane, and wherein the plasma further comprises a reducing gas.

19. The method of claim 18 wherein the reducing gas comprises carbon monoxide (CO).

20. The method of claim 5, wherein the halogen containing gas comprises a chlorine containing gas.

21. The method of claim 20 wherein said chlorine containing gas is Cl$_2$.

22. The method of claim 5, wherein the hydrocarbon gas is methane (CH$_4$).

23. The method of claim 5 further comprising:
   applying a bias power to a biasing element of 0 to 100 W.

24. The method of claim 12, wherein the halogen containing gas comprises a chlorine containing gas.

25. The method of claim 24 wherein said chlorine containing gas is Cl$_2$.

26. The method of claim 12, wherein the hydrocarbon gas is methane (CH$_4$).

27. The method of claim 12 further comprising:
   applying a bias power to a biasing element of 0 to 100 W.

28. The method of claim 14, wherein the halogen containing gas comprises a chlorine containing gas.

29. The method of claim 28 wherein said chlorine containing gas is Cl$_2$.

30. The method of claim 14, wherein the hydrocarbon gas is methane (CH$_4$).

31. The method of claim 14 further comprising:
   applying a bias power to a biasing element of 0 to 100 W.

* * * * *

UNITED STATES PATENT AND TRADEMARK OFFICE
CERTIFICATE OF CORRECTION

PATENT NO. : 7,217,665 B2
APPLICATION NO. : 10/301239
DATED : May 15, 2007
INVENTOR(S) : Nallan et al.

It is certified that error appears in the above-identified patent and that said Letters Patent is hereby corrected as shown below:

On the face page, in field (56), under "U.S. Patent Documents", in column 2, line 15, after "2002/0096695 A1" delete "7/2004" and insert -- 7/2002 --, therefor.

On the face page, in field (56), under "U.S. Patent Documents", in column 2, line 16, after "2002/0132437 A1" delete "9/2004" and insert -- 9/2002 --, therefor.

In column 2, line 20, delete "HCI" and insert -- HCl --, therefor.

In column 4, line 53, delete "mtorr," and insert -- mTorr, --, therefor.

In column 4, line 58, delete "mtorr," and insert -- mTorr, --, therefor.

In column 6, line 21, in Claim 4, delete "scan" and insert -- sccm --, therefor.

In column 6, line 23, in Claim 5, delete "comprising;" and insert -- comprising: --, therefor.

In column 8, line 1, in Claim 17, delete "workplace" and insert -- workpiece --, therefor.

Signed and Sealed this

Seventeenth Day of July, 2007

JON W. DUDAS
*Director of the United States Patent and Trademark Office*

UNITED STATES PATENT AND TRADEMARK OFFICE
CERTIFICATE OF CORRECTION

PATENT NO. : 7,217,665 B2
APPLICATION NO. : 10/301239
DATED : May 15, 2007
INVENTOR(S) : Nallan et al.

It is certified that error appears in the above-identified patent and that said Letters Patent is hereby corrected as shown below:

On the cover page,

[*] Notice: Subject to any disclaimer, the term of this patent is extended or adjusted under 35 USC 154(b) by (42) days Delete the phrase "by 42 days" and insert -- by 120 days--

Signed and Sealed this

Ninth Day of October, 2007

JON W. DUDAS
*Director of the United States Patent and Trademark Office*